United States Patent
Kobayashi et al.

(10) Patent No.: US 10,015,430 B2
(45) Date of Patent: Jul. 3, 2018

(54) SOLID STATE IMAGE DEVICE AND IMAGE SYSTEM

(71) Applicant: CANON KABUSHIKI KAISHA, Tokyo (JP)

(72) Inventors: Hideo Kobayashi, Tokyo (JP); Kei Ochiai, Inagi (JP); Masaki Sato, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 100 days.

(21) Appl. No.: 15/296,749

(22) Filed: Oct. 18, 2016

(65) Prior Publication Data

US 2017/0155862 A1     Jun. 1, 2017

(30) Foreign Application Priority Data

Nov. 30, 2015  (JP) .................. 2015-233016

(51) Int. Cl.
| | |
|---|---|
| *H04N 3/14* | (2006.01) |
| *H03M 1/12* | (2006.01) |
| *H04N 5/378* | (2011.01) |
| *H01L 27/146* | (2006.01) |

(52) U.S. Cl.
CPC ....... *H04N 5/378* (2013.01); *H01L 27/14609* (2013.01); *H01L 27/14636* (2013.01)

(58) Field of Classification Search
CPC .... H01L 27/14636; H03M 1/00–1/645; H04N 5/3355; H04N 5/3745; H04N 5/37455; H04N 5/378; H04N 5/369; H04N 5/335
See application file for complete search history.

(56) References Cited

U.S. PATENT DOCUMENTS

| | | |
|---|---|---|
| 7,639,305 B2 | 12/2009 | Koizumi |
| 7,990,440 B2 | 8/2011 | Kobayashi |
| 8,710,558 B2 | 4/2014 | Inoue |
| 8,835,828 B2 | 9/2014 | Kobayashi |
| 8,884,391 B2 | 11/2014 | Fudaba |
| 9,264,641 B2 | 2/2016 | Kobayashi |
| 9,305,954 B2 | 4/2016 | Kato |
| 9,357,122 B2 | 5/2016 | Kususaki |

(Continued)

FOREIGN PATENT DOCUMENTS

JP     2008-54246     3/2008

*Primary Examiner* — Sinh Tran
*Assistant Examiner* — Selam Gebriel
(74) *Attorney, Agent, or Firm* — Fitzpatrick, Cella, Harper & Scinto

(57) ABSTRACT

A solid state image device includes a pixel unit including a plurality of pixels arranged in a matrix; an analog-to-digital conversion unit that converts a signal from the pixel unit into a digital signal; a digital circuit unit that processes the digital signal from the analog-to-digital conversion unit; and a wiring that supplies a predetermined voltage to the pixel unit. The wiring includes a first wiring section facing the pixel unit, a second wiring section facing at least one of the analog-to-digital conversion unit and the digital circuit unit, and a third wiring section connected to an electrode pad and connected to an electrode pad and between the second wiring section and the electrode pad, and the width of the second wiring section is smaller than respective widths of the first wiring section and the third wiring section.

14 Claims, 12 Drawing Sheets

(56) References Cited

U.S. PATENT DOCUMENTS

| | | |
|---|---|---|
| 9,407,847 B2 | 8/2016 | Maehashi |
| 9,438,828 B2 | 9/2016 | Itano |
| 9,509,931 B2 | 11/2016 | Kobayashi |
| 2012/0175503 A1 | 7/2012 | Kuroda |
| 2013/0140440 A1 | 6/2013 | Kobayashi |
| 2013/0176470 A1* | 7/2013 | Kobayashi ........ H01L 27/14601 348/302 |
| 2015/0201144 A1 | 7/2015 | Kobayashi |
| 2016/0227141 A1 | 8/2016 | Kobayashi |

* cited by examiner

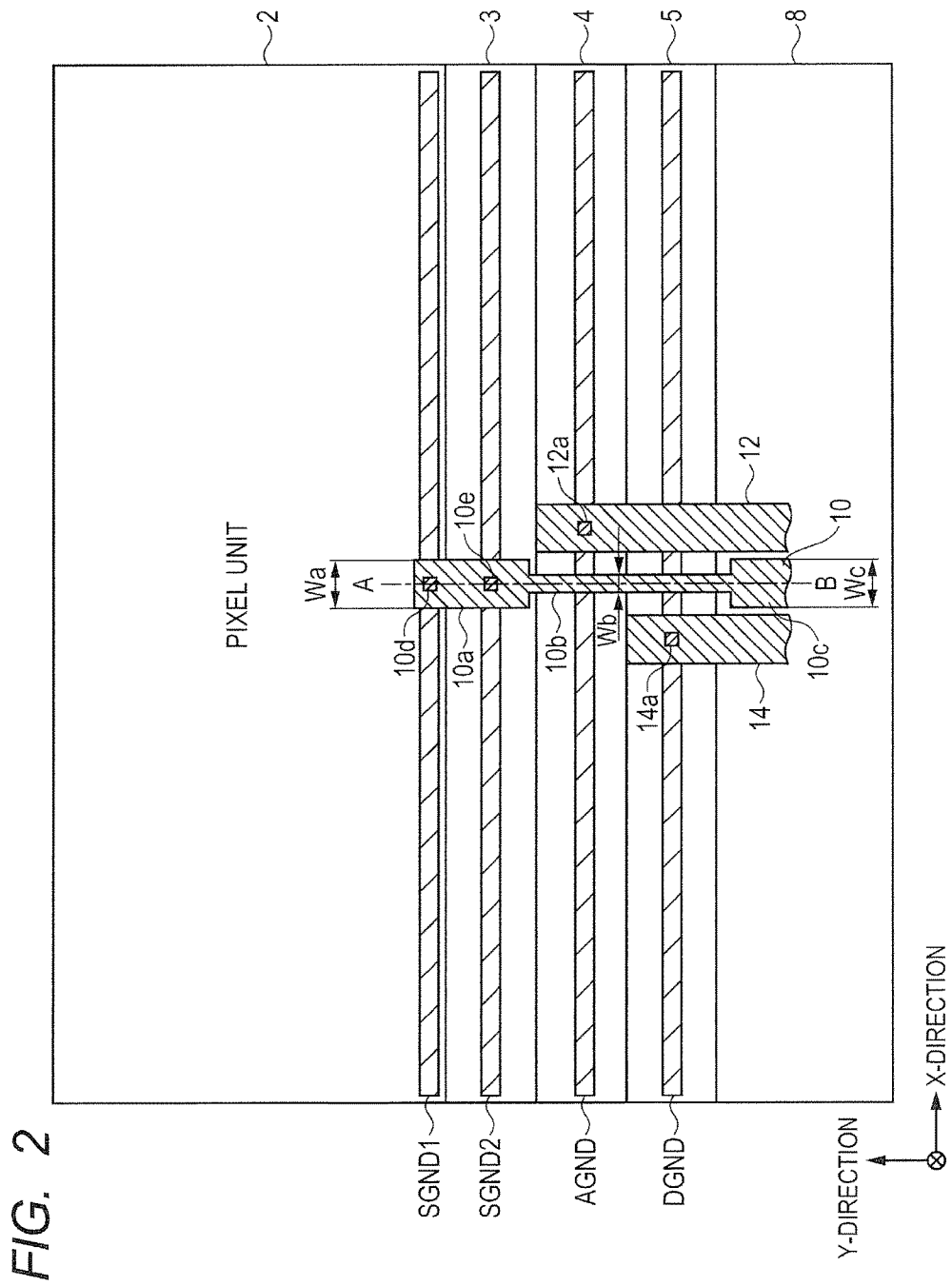

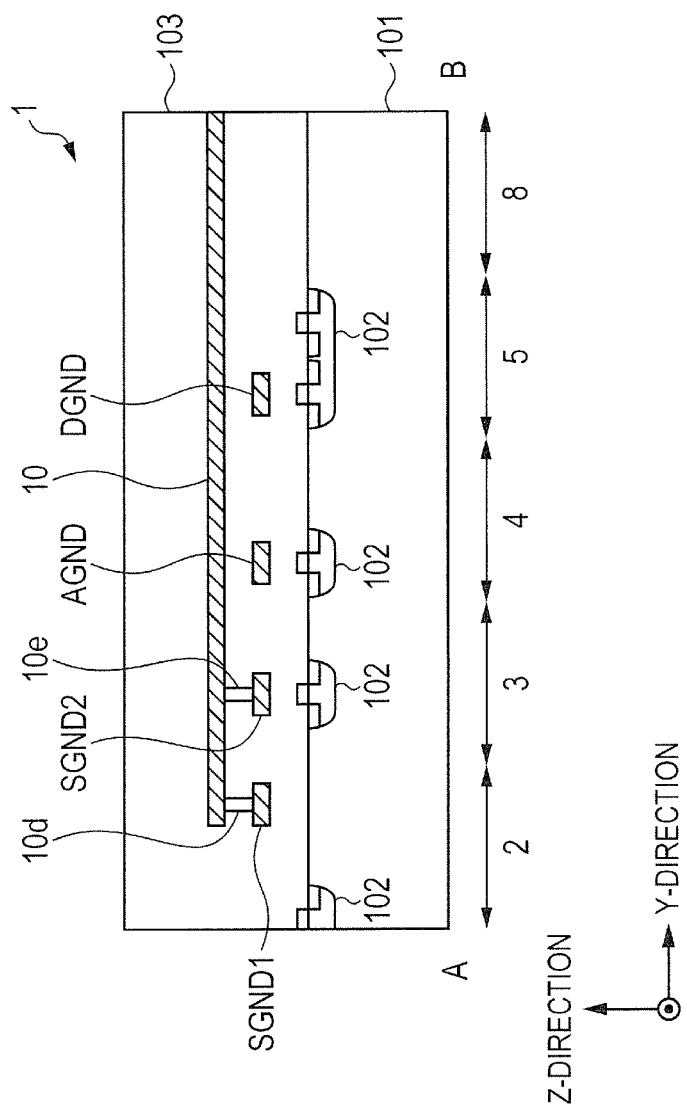

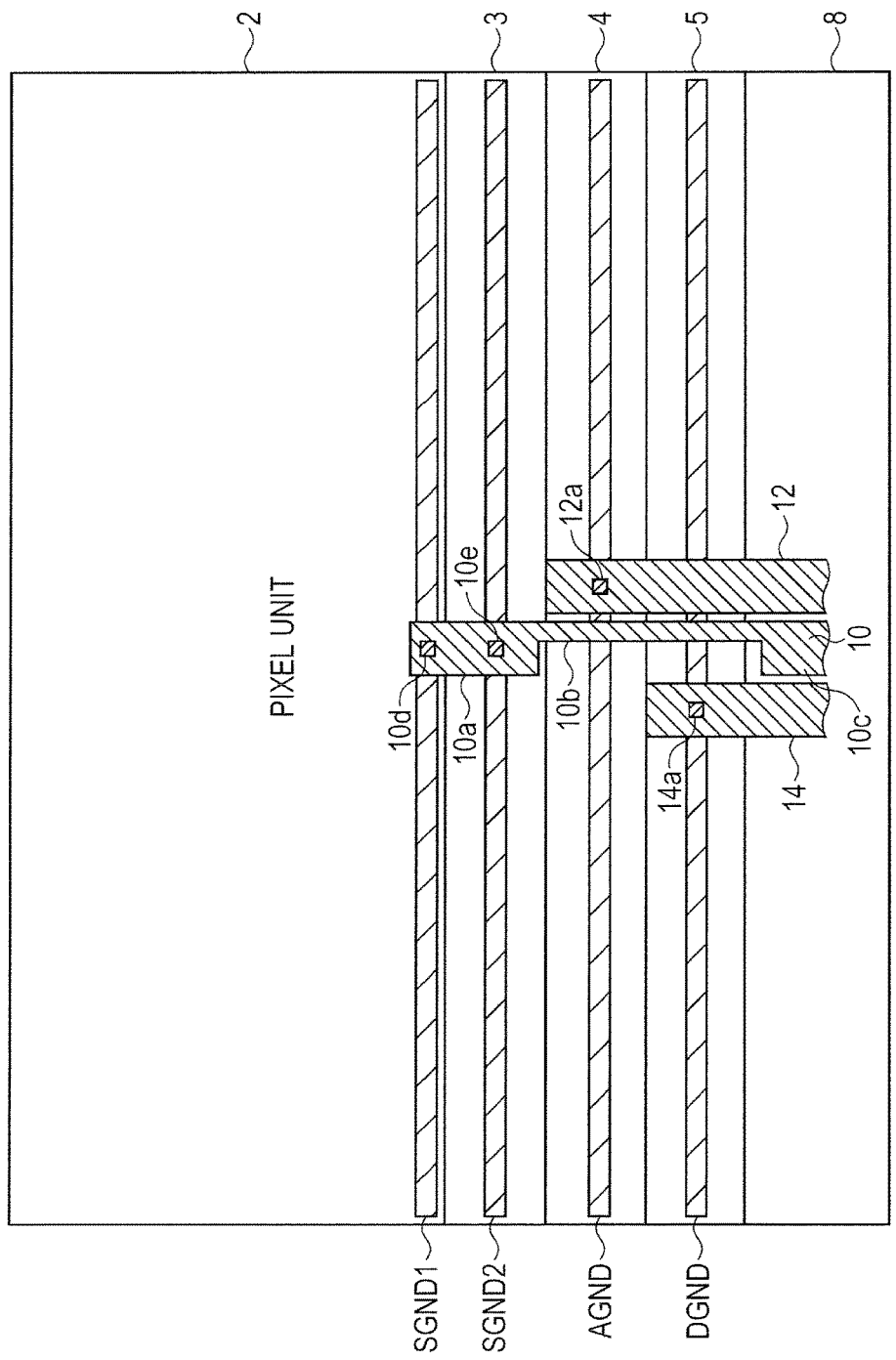

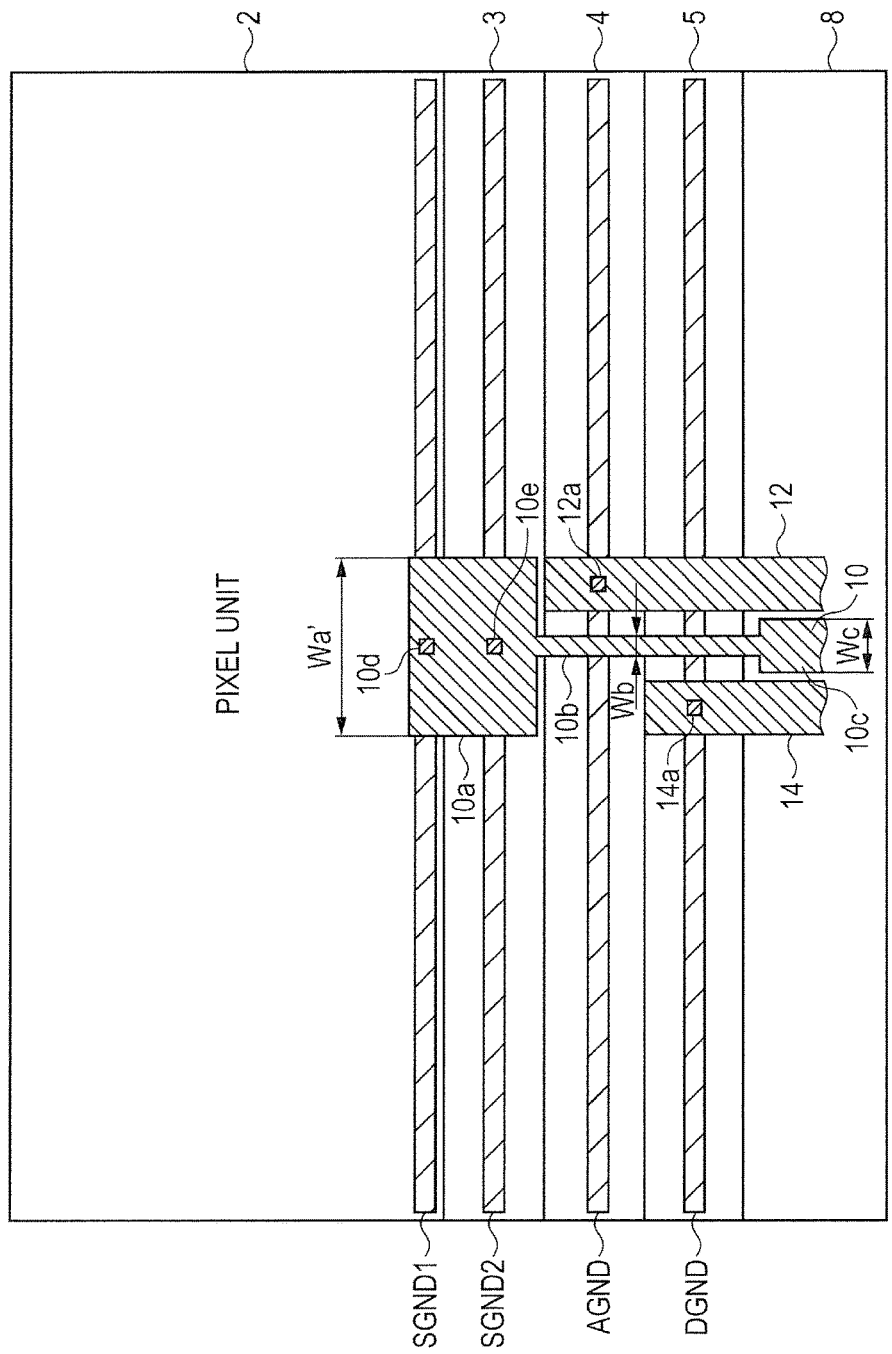

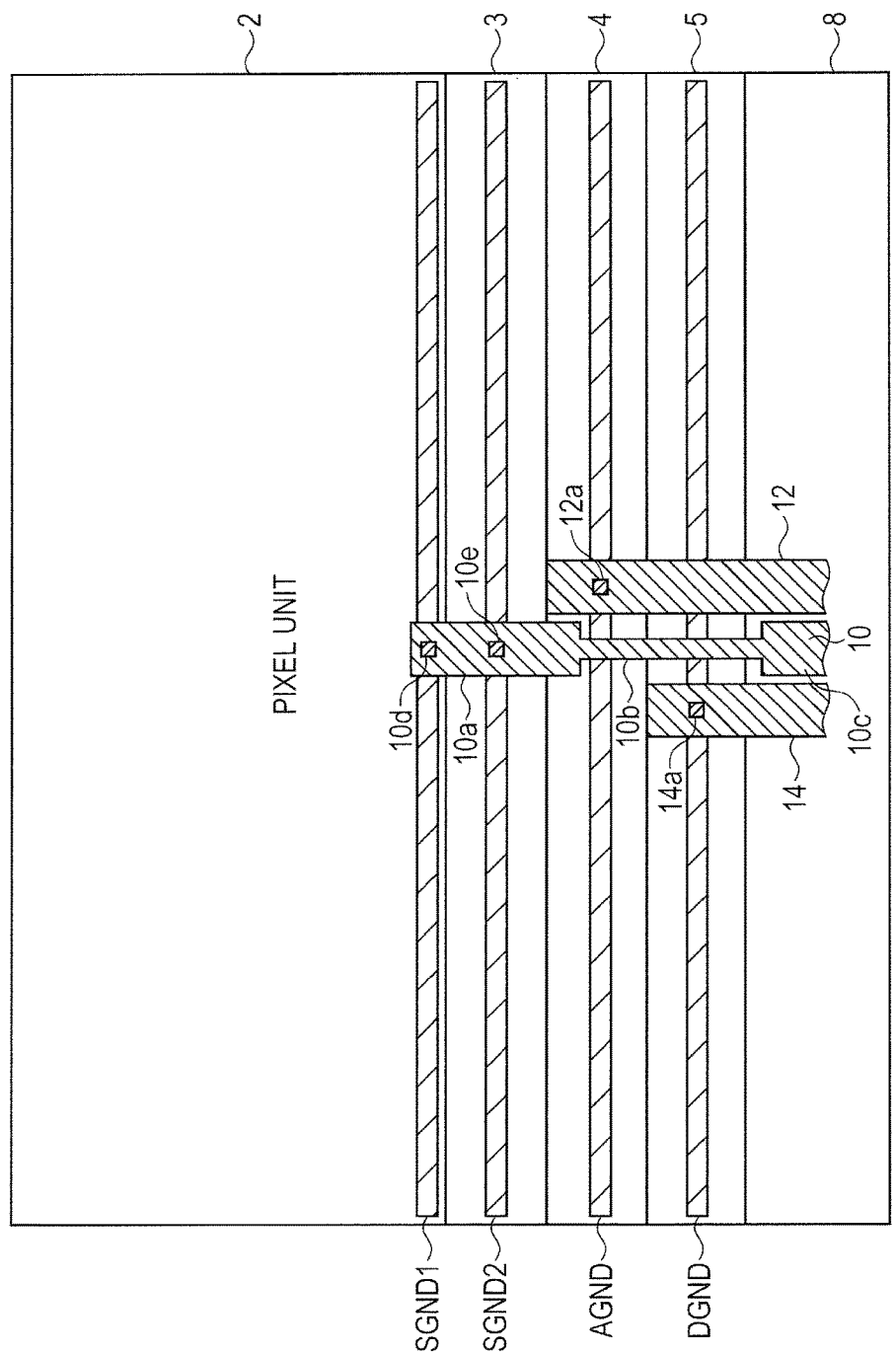

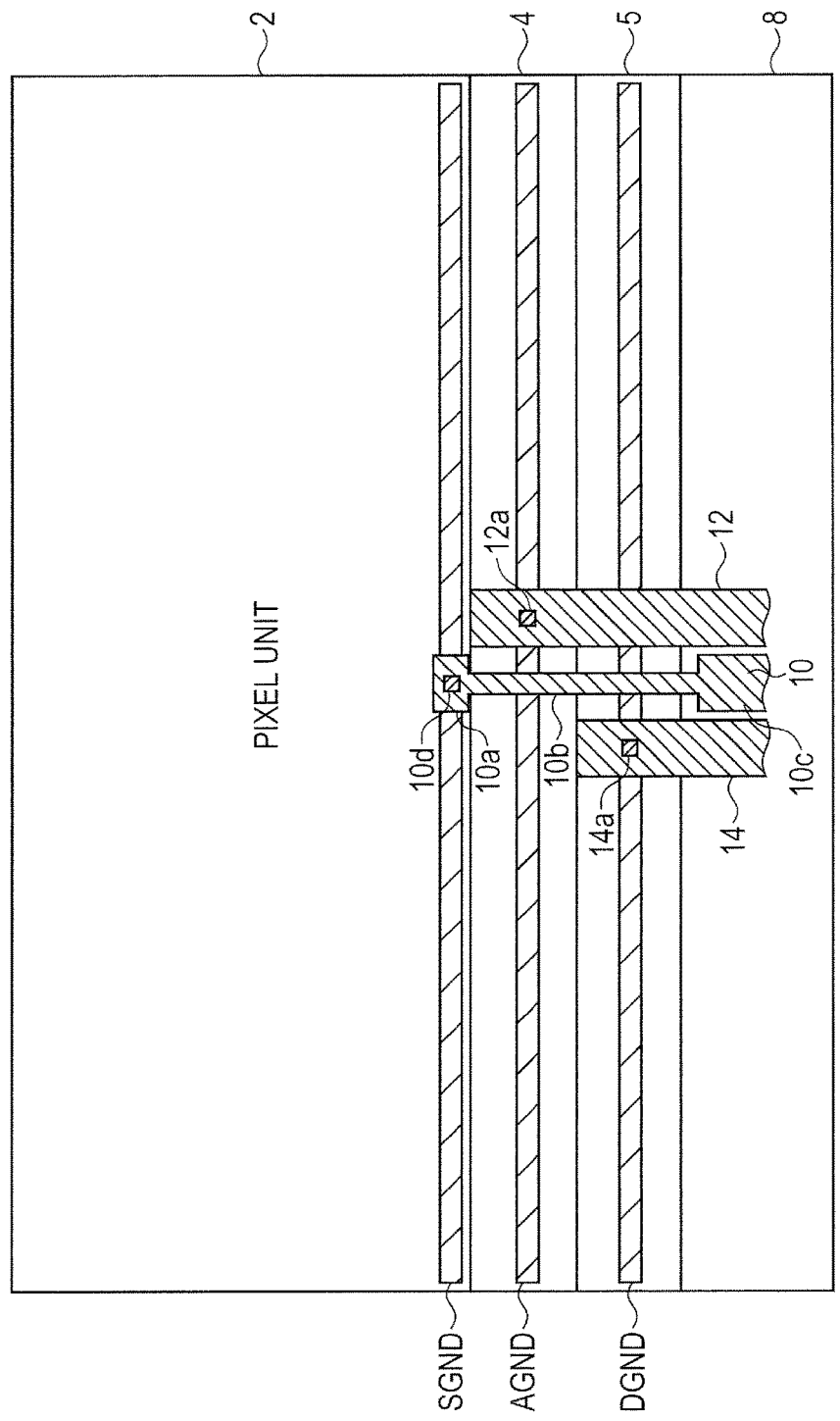

SOLID STATE IMAGE DEVICE AND IMAGE SYSTEM

BACKGROUND OF THE INVENTION

Field of the Invention

The present invention relates to a solid state image device and an image system.

Description of the Related Art

Accompanied by a higher density of pixels and a higher quality of an image in solid state image devices, various efforts have been taken for the structure of a power source line. Japanese Patent Application Laid-open No. 2008-054246 discloses an arrangement that reduces a wiring resistance of a power source line by connecting a first power source line and a second power source line via a cross connection line. Further, it is described that concentration of currents can be avoided to further reduce a wiring resistance by connecting the first and second power source lines in parallel via a plurality of cross connection lines.

In a solid state image device having an analog-to-digital conversion circuit, the analog-to-digital conversion circuit and/or a digital circuit may affect the image quality resulting in degradation thereof. In this case, a mere reduction of a wiring resistance described in Japanese Patent Application Laid-open No. 2008-054246 does not necessarily provide a sufficient quality of an image.

SUMMARY OF THE INVENTION

A solid state image device as one aspect of the present invention includes: a pixel unit including a plurality of pixels arranged in a matrix; an analog-to-digital conversion unit that converts a signal from the pixel unit into a digital signal; a digital circuit unit that processes the digital signal from the analog-to-digital conversion unit; and a wiring that supplies a voltage to the pixel unit. The wiring includes a first wiring section facing the pixel unit, a second wiring section facing at least one of the analog-to-digital conversion unit and the digital circuit unit, and a third wiring section connected to an electrode pad and between the second wiring section and the electrode pad, and a width of the second wiring section is smaller than respective widths of the first wiring section and the third wiring section.

Further features of the present invention will become apparent from the following description of exemplary embodiments with reference to the attached drawings.

BRIEF DESCRIPTION OF THE DRAWINGS

FIG. 2 is a schematic view of the solid state image device according to the first embodiment.

FIG. 3 is a schematic sectional view of the solid state image device according to the first embodiment.

FIG. 6 is a schematic view of a solid state image device of a second embodiment.

FIG. 7 is a schematic view of a solid state image device of a third embodiment.

FIG. 8 is a schematic view of a solid state image device of a fourth embodiment.

FIG. 9 is a schematic view of a solid state image device of a fifth embodiment.

DESCRIPTION OF THE EMBODIMENTS

Preferred embodiments of the present invention will now be described in detail in accordance with the accompanying drawings.

First Embodiment

Figure 1:
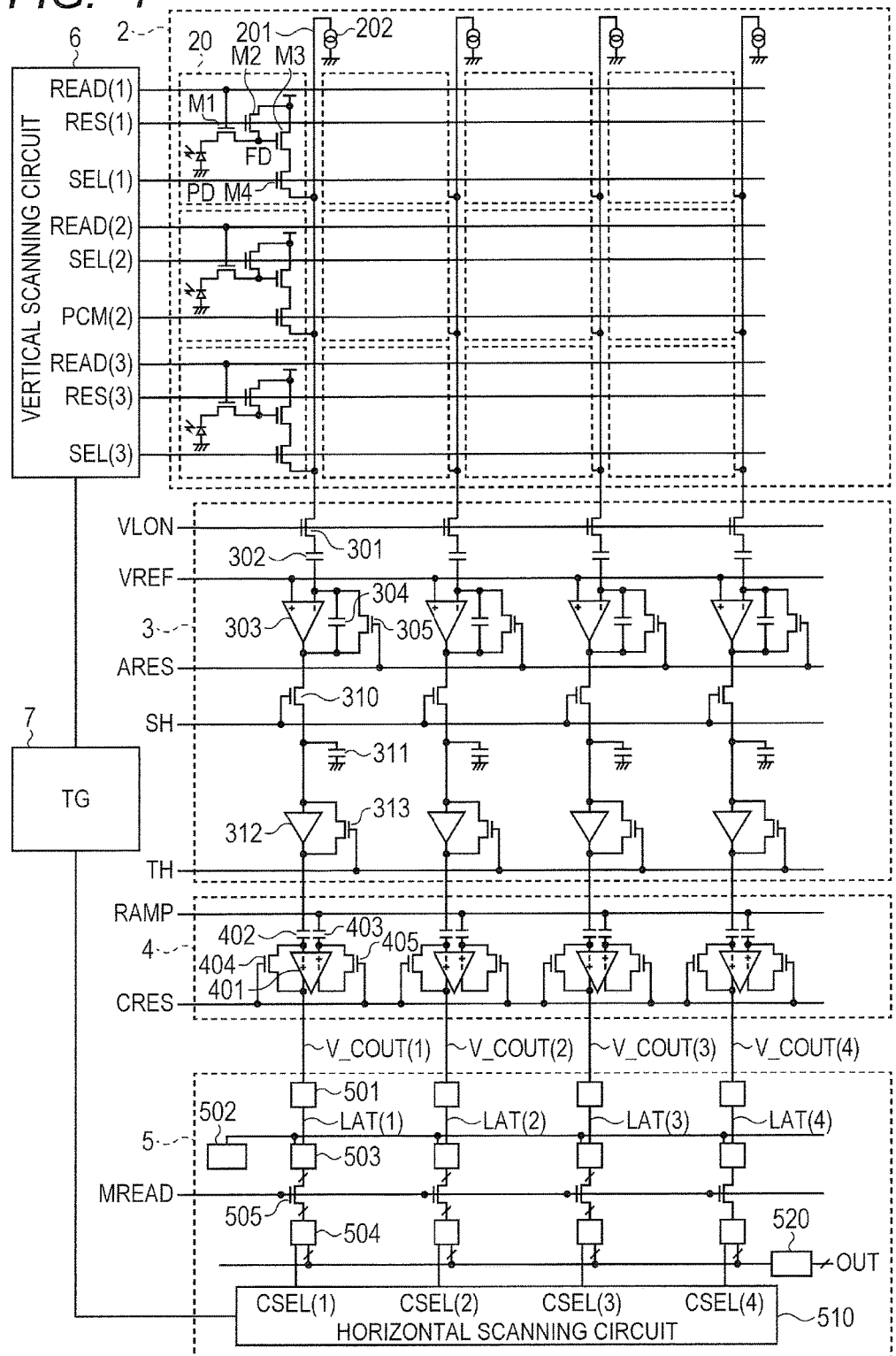
FIG. 1 is a block diagram of a solid state image device according to a first embodiment.

FIG. 1 is a block diagram illustrating a solid state image device of the first embodiment. The solid state image device is a CMOS image sensor including a pixel unit 2, a column amplifier circuit unit 3, an analog-to-digital conversion unit 4, a digital circuit unit 5, a vertical scanning circuit 6, and a timing generator (TG) circuit 7. The pixel unit 2 includes a plurality of pixels 20 arranged in a two-dimensional matrix. Although FIG. 1 depicts the pixels 20 of only three rows by four columns for simplified illustration, the number of pixels 20 is not limited thereto. Other than effective pixels that output images, the pixel unit 2 may include pixels which output no image, such as light shielding pixels, dummy pixels having no photoelectric conversion unit, or the like. Each of the pixels 20 includes a photoelectric conversion unit PD, a floating diffusion unit FD, a transfer transistor M1, a reset transistor M2, an amplification transistor M3, and a selection transistor M4.

Each of the transistors M1 to M3 of the pixel 20 may be formed of an N-type CMOS transistor, for example. The photoelectric conversion unit PD is formed of an embedded photodiode and accumulates charges in accordance with an incident light. The transfer transistor M1, when turned on, transfers charges of the photoelectric conversion unit PD to the floating diffusion unit FD. The reset transistor M2, when turned on, resets the potential of the floating diffusion unit FD to a power source voltage. The floating diffusion unit FD has a predetermined capacitance and generates a voltage in accordance with charges. The amplification transistor M3 operates as a source follower in which the potential of the source changes in accordance with the potential of the floating diffusion unit FD. The selection transistor M4 electrically connects the source of the amplification transistor M3 to a column signal line 201. The column signal line 201 is connected to a current source 202 that functions as a load of the amplification transistor M3. In response to turning on of the selection transistor M4 on a row to be read out, a voltage in accordance with charges of the photoelectric conversion unit PD on that row is output to the column signal line 201.

The transistors M1 to M4 each are not limited to an N-type CMOS transistor and may be a P-type CMOS transistor. A configuration of the pixel 20 is not limited to the example illustrated in FIG. 1, and various pixels may be used. For example, a plurality of photoelectric conversion units PD may share a single amplification transistor M3 and, further, the pixel 20 may include an overflow drain that drains charges overflowing from the photoelectric conversion unit PD.

The column amplifier circuit unit 3 includes a switch 301, an input capacitor 302, a differential amplifier 303, a feedback capacitor 304, switches 305 and 310, a holding capacitor 311, a voltage follower 312, and a switch 313. The switch 301 is driven by a control signal VLON and electrically connects the column signal line 201 to the column amplifier circuit unit 3. A pixel signal from the column signal line 201 is input to the inverting input terminal of the differential amplifier 303 via the input capacitor 302. A reference voltage VREF is input to the non-inverting input terminal of the differential amplifier 303, and the feedback capacitor 304 and the switch 305 are connected in parallel between the inverting input terminal and the output terminal. A control signal ARES is applied to the gate of the switch 305. When the switch 305 is in an on-state, the feedback capacitor 304 is reset and the input capacitor 302 is clamped at the reference voltage VREF. When the switch 305 is in an off-state, the differential amplifier 303 amplifies a pixel signal at an amplification factor that is based on a capacitance ratio of the input capacitor 302 and the feedback capacitor 304.

The switch 310 and the holding capacitor 311 form a sample and hold unit. A control signal SH is applied to the gate of the switch 310 and, at a timing when the switch 310 is turned off from an on-state, a pixel signal is held in the holding capacitor 311. The sampled and held pixel signal is input to the voltage follower 312. The input and output terminals of the voltage follower 312 are connected to the switch 313, and a control signal TH is applied to the gate of the switch 313. The input terminal and the output terminal of the voltage follower 312 are short-circuited when the switch 313 is turned on, and the sampled and held pixel signal is output from the voltage follower 312 in response to the switch 313 being turned off.

The analog-to-digital conversion unit 4 includes a comparator 401, input capacitors 402 and 403, and switches 404 and 405. The inverting input terminal of the comparator 401 is input with a pixel signal via the input capacitor 402, and the non-inverting input terminal of the comparator 401 is input with a ramp signal RAMP via the input capacitor 403. The comparator 401 compares a pixel signal with the ramp signal RAMP and, when the ramp signal RAMP becomes larger than the pixel signal, inverts a signal V_COUT of the non-inverting output terminal of the comparator 401. A control signal CRES is applied to respective gates of the switches 404 and 405 and, in response to the switches 404 and 405 being turned on, the comparator 401 is reset.

The digital circuit unit 5 includes a pulse generation circuit 501, a counter 502, a first digital memory 503, a second digital memory 504, a switch 505, a horizontal scanning circuit 510, and a signal processing circuit 520. The pulse generation circuit 501 generates a pulse LAT when the signal V_COUT from the comparator 401 is inverted. The counter 502 counts the time from the time when the ramp signal RAMP has changed to the time when the pulse LAT is output, and then outputs the count value. The first digital memory 503 holds a count value and outputs the count value to the second digital memory 504 via the switch 505 driven by a control signal MREAD. In such a way, a pixel signal converted into a digital signal is held in the second digital memory 504 on each column.

The horizontal scanning circuit 510 includes a shift resistor and scans the second digital memory 504 by sequentially outputting column selection signals CSEL. The signal processing circuit 520 performs a correlated double sampling process based on a pixel signal at the time of a reset of the pixel 20 and a pixel signal at the time of photoelectric conversion and outputs a pixel signal where a noise component has been removed.

The vertical scanning circuit 6 drives control signals applied to the gates of the transistors M1, M2, and M4 of the pixels 20 and reads out the pixels 20 on a row basis. The control signals on each row include a control signal READ applied to the gate of the transfer transistor M1, a control signal RES applied to the gate of the reset transistor M2, and a control signal SEL applied to the gate of the selection transistor M4. The TG circuit 7 outputs the control signals VLON, ARES, SH, TH, CRES, and MREAD and controls operation timings of the entire image device including the vertical scanning circuit 6 and the horizontal scanning circuit 510.

Note that a plurality of pixel columns may be divided into two groups and each of the groups may be provided with the column amplifier circuit unit 3, the analog-to-digital conversion unit 4, and the digital circuit unit 5. In this case of FIG. 1, each set of the column amplifier circuit unit 3, the analog-to-digital conversion unit 4, and the digital circuit unit 5 may be formed in the lower side and the upper side of the pixel unit 2, respectively.

FIG. 2 is a schematic view of the solid state image device according to the present embodiment, which is a plan view of ground wirings. In FIG. 2, the pixel unit 2, the column amplifier circuit unit 3, the analog-to-digital conversion unit 4, the digital circuit unit 5, and the region 8 are arranged in this order in a Y-direction. The Y-direction here represents a direction in which the column signal line 201 extends, and an X-direction represents a direction in which the pixels 20 on a row are aligned. In the pixel unit 2, a ground wiring SGND1 extends in the X-direction and supplies a ground potential to circuits such as the pixel 20 and the current source 202. In the column amplifier circuit unit 3, a ground wiring SGND2 extends in the X direction and supplies a ground potential to circuits such as the differential amplifier 303, the holding capacitor 311, and the voltage follower 312. In a similar manner, in the analog-to-digital conversion unit 4 and the digital circuit unit 5, a ground wiring AGND and a ground wiring DGND extend in the X-direction, respectively. The ground wiring AGND supplies a ground potential to circuits such as the comparator 401. The ground wiring DGND supplies a ground potential to the pulse generation circuit 501, the counter 502, the digital memories 503 and 504, the switch 505, the horizontal scanning circuit 510, and the signal processing circuit 520.

The ground wiring 10 extends in the Y-direction from the region 8 to the column amplifier circuit unit 3 and the pixel unit 2. That is, the ground wiring 10 extends from the region 8 which is outside the digital circuit unit 5 to the pixel unit 2 intersecting with the digital circuit unit 5, the analog-to-digital conversion unit 4, and the column amplifier circuit unit 3. The ground wiring 10 may include wiring sections 10a, 10b, and 10c and plugs 10e and 10d. The wiring section (the third wiring section) 10c is located in the region 8, and the wiring section 10c is connected to an external electrode (an electrode pad) (not depicted) and is between the wiring section 10b and the external electrode. The wiring section 10c is a portion other than the first and second wiring sections of the ground wiring 10. The wiring section (the second wiring section) 10b faces the analog-to-digital conversion unit 4 and the digital circuit unit 5 and, in a planer view, intersects with the analog-to-digital conversion unit 4 and the digital circuit unit 5. The wiring section 10b may face at least one of the analog-to-digital conversion unit 4 and the digital circuit unit 5. The width Wb of the wiring section 10b is narrower than each of the width Wa of the rising section 10a and the width Wc of the wiring section 10c, and the ground wiring 10 has recess portions in the wiring section 10b. In the present embodiment, respective widths of the wiring sections 10a to 10c have a relationship of Wa≈Wc>Wb. The wiring sections 10a, 10b, and 10c may have portions such that the respective width of the portions of the wiring sections 10a to 10c do not have the relationship of Wa≈Wc>Wb. For instance, the width of a portion of the wiring section 10c, the portion being connected to the electrode pad, may be greater than the width of the second wiring section 10b.

The wiring section (the first wiring section) 10a is formed facing the pixel unit 2 and the column amplifier circuit unit 3, and the plugs 10d and 10e are formed on the wiring section 10a. The plug 10d is electrically connected to the ground wiring SGND1 of the pixel unit 2, and the plug 10e is electrically connected to the ground wiring SGND2 of the column amplifier circuit unit 3.

Ground wirings (other wirings) 12 and 14 are formed in both sides of the ground wiring 10. The ground wiring 12 extends from the region 8 to the analog-to-digital conversion unit 4 and is electrically connected to the ground wiring AGND of the column amplifier circuit unit 3 via a plug 12a. The end of the ground wiring 12 does not extend beyond the analog-to-digital conversion unit 4 and thus does not face the pixel unit 2. This can reduce parasitic capacitances between the ground wiring 12 and the pixel unit 2 and between the ground wiring 12 and the column amplifier circuit unit 3. The ground wiring 14 extends from the region 8 to the digital circuit unit 5 and is electrically connected to the ground wiring DGND of the digital circuit unit 5 via a plug 14a. The ground wirings 12 and 14 each have a constant wiring width. Further, the end of the ground wiring 14 does not extend beyond the digital circuit unit 5 and thus does not face the pixel unit 2. The ends of the ground wirings 12 and 14 are electrically connected to external electrodes (not depicted), respectively.

FIG. 3 is a schematic sectional view of the solid state image device according to the present embodiment and illustrates the sectional structure taken along a line A-B of FIG. 2. A plurality of P-type semiconductor regions 102 are formed on the upper part of the N-type semiconductor substrate 101, and the pixel unit 2, the column amplifier circuit unit 3, the analog-to-digital conversion unit 4, and the digital circuit unit 5 are formed on the semiconductor regions 102, respectively. A plurality of wiring layers are formed on or over the semiconductor substrate 101, and the ground wirings SGND1, SGND2, AGND, and DGND are formed in a first wiring layer. A second wiring layer is formed on or over the first wiring layer, and the ground wiring 10 is formed in the second wiring layer. The ground wiring 10 is connected to the ground wiring SGND1 via the plug 10d and, also, the ground wiring 10 is connected to the ground wiring SGND2 via the plug 10e. The first and second wiring layers are made of aluminum, copper, or the like, and the first and second wiring layers are formed inside the interlayer insulating layer 103, respectively.

Although not depicted, a wiring layer for interconnecting circuit components such as a gate electrode, source/drain electrodes, and the like is provided on the top of the P-type semiconductor regions 102. Further, a micro lens that collects a light and a color filter that diffracts a light may be provided over the top of the pixel unit 2. The photoelectric conversion unit PD of the pixel unit 2 may be an embedded photodiode having a P-type semiconductor region, or may be a photogate.

In the analog-to-digital conversion unit 4, due to an output inversion of the comparator 401, the power source voltage and the ground voltage of the comparator 401 and voltages of other nodes may vary. Further, also in the digital circuit unit 5, the power source voltage and the ground voltage of the digital memories 503 and 504 and voltages of other nodes may vary. In the present embodiment, the width of the wiring section 10b of the grounding wiring 10 is narrower (smaller) than each width of the different wiring sections 10a and 10c as described above. Therefore, a parasitic capacitance between the ground wiring 10 and the analog-to-digital conversion unit 4 and between the ground wiring 10 and the digital circuit unit 5 can be reduced, which allows for a reduction of variations in the ground potential that would otherwise be caused by the parasitic capacitance.

In other sections than the wiring section 10b facing the analog-to-digital conversion unit 4 and the digital circuit unit 5, the width of the ground wiring 10 is not reduced and therefore an increase in the wiring resistance of the ground wiring 10 can be suppressed to the minimum. Further, the ground wiring 12 of the analog-to-digital conversion unit 4 and the ground wiring 14 of the digital circuit unit 5 do not reach the column amplifier circuit unit 3 and the pixel unit 2. This can prevent a noise or the like from affecting the column amplifier circuit unit 3 and the pixel unit 2 via the ground wirings 12 and 14.

Figure 4A:
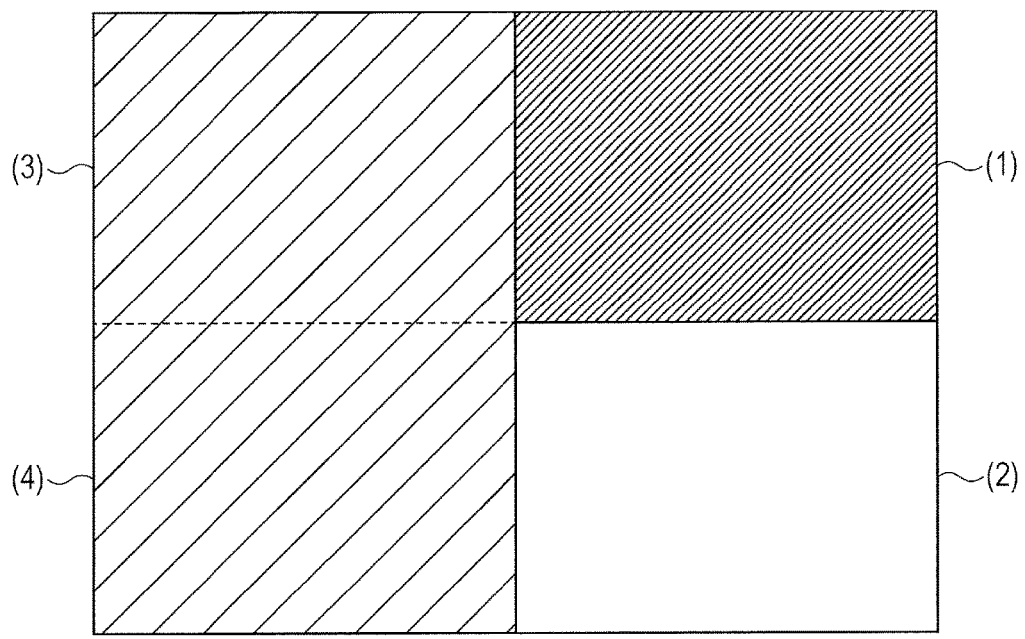
FIGS. 4A and 4B are diagrams illustrating a comparison example of capturing results.
Figure 4B:
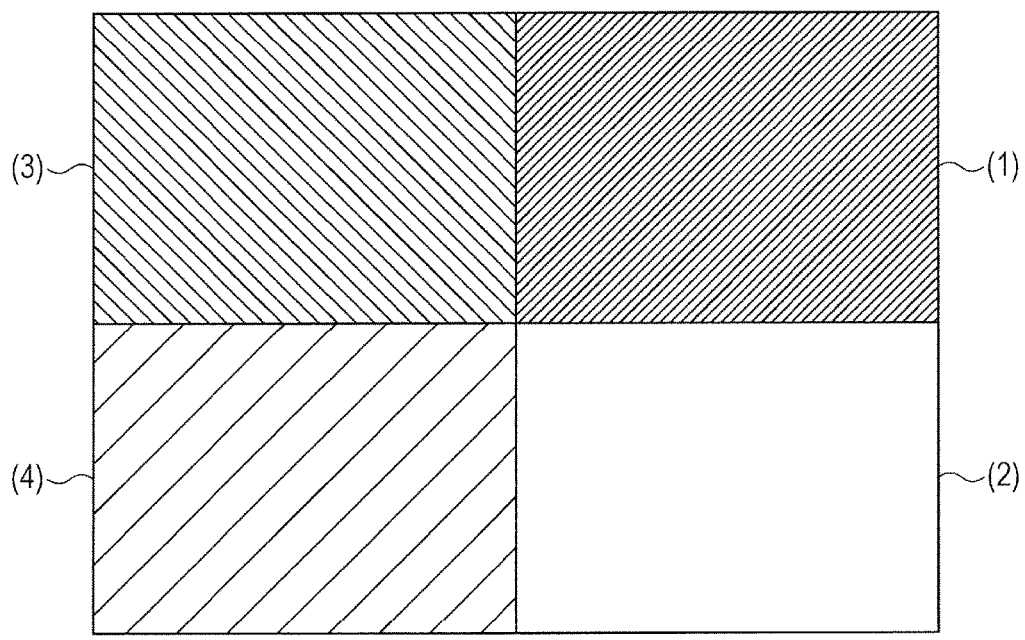

FIG. 4A and FIG. 4B are views illustrating a comparison example of capturing results. In this illustration, FIG. 4A depicts a chart of a subject used for comparison of the capturing results. An area (1) is black, an area (2) is white, and areas (3) and (4) are gray with the same brightness. When this chart is captured by the solid state image device, two signals with different voltages are simultaneously output from a plurality of the column signal lines 201. At this time, when no recess portion is formed in the ground wiring 10, an analog-to-digital conversion operation on a particular column may affect an analog-to-digital conversion operation on another column via the ground wiring 10. As a result, as illustrated in FIG. 4B, the brightness of the area (3) will decrease, and thus the area (3) will be captured to be darker than the area (4).

Figure 5A:
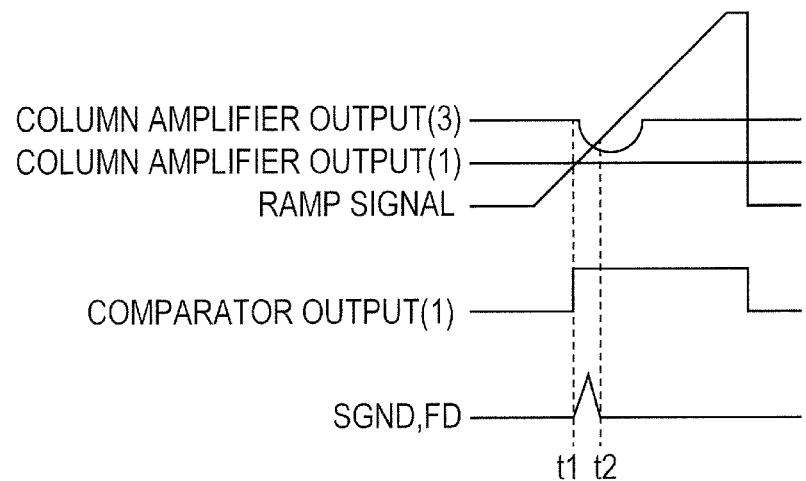
FIGS. 5A and 5B are diagrams illustrating a comparison example of capturing results.
Figure 5B:
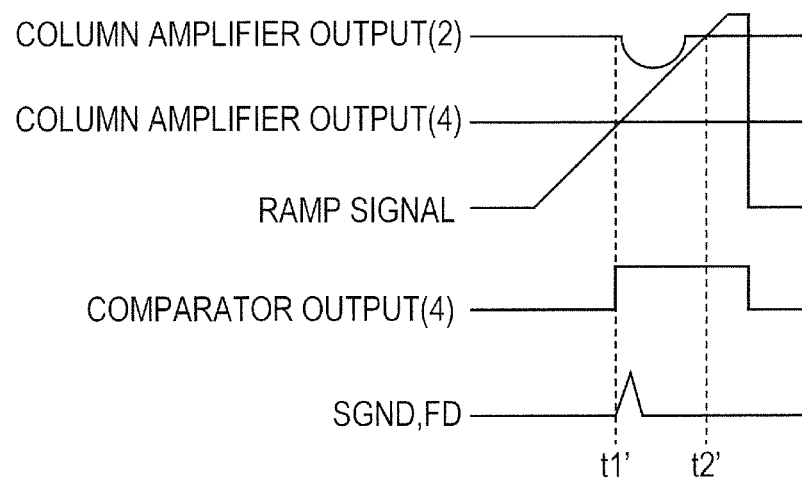

With reference to FIG. 5A and FIG. 5B, the phenomenon illustrated above will be described in detail. FIG. 5A is a timing chart of signals in the areas (1) and (3), which represents respective temporal changes of the output signal of the column amplifier circuit unit 3, the ramp signal, the output signal of the comparator 401, the potential of the ground wiring SGND, and the ground potential of the floating diffusion unit FD. The output signal of the column amplifier circuit unit 3 corresponding to the area (1) is lower than the output signal of the column amplifier circuit unit 3 corresponding to the area (3). Therefore, an increase of the ramp signal causes the signals V_COUT of the comparators 401 on a plurality of columns in the area (1) to be inverted simultaneously at the time t1. At this time, ground potentials, a power source voltage, voltages of output nodes of some circuits, and the like may vary due to the inversion of the signals V_COUT of the comparators 401, a latch operation of a count value to the digital memory 503, and the like. When no recess portion is formed in the ground wiring 10, the parasitic capacitances between the ground wiring 10 and the comparator 401 and between the ground wiring 10 and the digital circuit unit 5 will increase. Therefore, the ground potential of the ground wiring 10 will vary and, thereby, the ground potentials of the ground wirings SGND1 and SGND2 will also vary. For example, as illustrated in FIG. 5A, in response to the increase of the potential of the floating diffusion unit FD and the potential of the ground wiring SGND2 of the column amplifier circuit unit 3, the output signal of the column amplifier circuit unit 3 corresponding to the area (3) decreases. As a result, at the time t2, the signals V_COUT of the comparator 401 (corresponding to the area (3)) is inverted at a timing earlier than the original timing, resulting in a lower value of the converted digital signal.

FIG. 5B is a timing chart of signals in the areas (2) and (4), which represents respective temporal changes of the output signal of the column amplifier circuit unit 3, the ramp signal, the output signal of the comparator 401, the potential of the ground wiring SGND, and the ground potential of the floating diffusion unit FD. The output signal of the column amplifier circuit unit 3 corresponding to the area (4) is lower than the output signal of the column amplifier circuit unit 3 corresponding to the area (2). At the time t1', the signals V_COUT of the comparators 401 on a plurality of columns in the area (4) are simultaneously inverted, and the potentials of the ground wirings SGND1 and SGND2 and the potential of the floating diffusion unit FD may vary. At this time, although the output signal of the column amplifier circuit unit 3 corresponding to the area (2) decreases, the output signal of the white area (2) is higher than the ramp signal. Thus, the signal V_COUT of the comparator 401 (corresponding to the area (2)) is not inverted. Then, the potential of the ground wiring SGND and the ground potential of the floating diffusion unit FD returns to a stable state. After the output signal of the column amplifier circuit unit 3 increases to the original voltage at the time t2', the signal V_COUT of the comparator 401 (corresponding to the area (2)) is inverted. Thus, unlike the case of the area (3), no decrease of the output occurs in the area (4). Therefore, the digital signal values of the areas (3) and (4), which have to be the same value, are different from each other, and thus the area (3) will appear darker than the area (4) as illustrated in FIG. 4B.

The above description has provided the example in which a variation of the ground potential of the ground wiring SGND1 causes a variation of the potential of the floating diffusion unit FD. In addition to the above, a variation of the ground potentials of the ground wirings SGND1 and SGND2 may affect signals of various circuits, such as input and output signals of the differential amplifier 303 in the column amplifier circuit unit 3.

In the present embodiment, the width of the wiring section 10b facing the analog-to-digital conversion unit 4 or the digital circuit unit 5 is narrower than each width of the different wiring sections 10a and 10c. This can reduce the parasitic capacitance between the analog-to-digital conversion unit 4 or the digital circuit unit 5 and the ground wiring 10. Therefore, affection from an analog-to-digital conversion operation on another column can be avoided and thus degradation of the image quality such as illustrated in FIG. 4A, FIG. 4B, FIG. 5A, and FIG. 5B can be suppressed. Note that FIG. 4A, FIG. 4B, FIG. 5A, and FIG. 5B are mere examples of degradation of the image quality and the present embodiment can suppress various types of degradation of the image quality that would otherwise be caused by the parasitic capacitance.

Second Embodiment

FIG. 6 is a schematic view of a solid state image device according to the second embodiment. In the following, features that are different from those of the first embodiment will mainly be described. While the recess portions are formed in both sides of the wiring section 10b of the ground wiring 10 in the first embodiment, a recess portion is formed in only one side of the wiring section 10b in a planer view in the present embodiment. Also in the present embodiment, the width of the wiring section 10b is narrower than each width of the different wiring sections 10a and 10c. The parasitic capacitance between the analog-to-digital conversion unit 4 or the digital circuit unit 5 and the ground wiring 10 can be reduced, which allows for avoiding affection from an analog-to-digital conversion operation on another column.

Third Embodiment

FIG. 7 is a schematic view of a solid state image device according to the third embodiment. In the present embodiment, the width Wa' of the wiring section 10a of the ground wiring 10 is wider than the width Wa of the first and second embodiments. Respective widths of the wiring sections 10a to 10c have a relationship of Wa'>We>Wb. This allows for a lower resistance of the wiring section 10a in the pixel unit 2 and the column amplifier circuit unit 3. Further, the width Wa' of the wiring section 10a is substantially the same as the entire width across the ground wirings 10, 12, and 14 (a distance from one side end to the other side end of these wirings). The present embodiment also allows for the advantages of the first and second embodiments. That is, affection from an analog-to-digital conversion operation on another column can be avoided and degradation of the image quality can be suppressed.

Fourth Embodiment

FIG. 8 is a schematic view of a solid state image device according to the fourth embodiment. The wiring section 10a extends and reaches a part of the region of the analog-to-digital conversion unit 4. In the analog-to-digital conversion unit 4, a pixel signal is input to the input capacitor 402, and a ramp signal is input to the input capacitor 403. Since the changes in the voltages are slow in the input capacitors 402 and 403, the ground potential of the ground wiring 10 is less likely to be affected by the parasitic capacitance even with a larger width of the wiring section 10a over the input capacitors 402 and 403. In the present embodiment, the length of the narrow wiring section 10b can be short as much as possible in the ground wiring 10 and this allows for a reduction in the resistance of the ground wiring 10.

Fifth Embodiment

FIG. 9 is a schematic view of a solid state image device according to the fifth embodiment. The solid state image device according to the present embodiment does not have the column amplifier circuit unit 3, and the signal from the pixel unit 2 is directly input to the analog-to-digital conversion unit 4. The wiring section 10a of the ground wring 10 is electrically connected to the ground wiring SGND via the plug 10d. Also in the present embodiment, the width of the wiring section 10b over the analog-to-digital conversion unit 4 and the digital circuit unit 5 is narrower than other wiring sections. Thus, the parasitic capacitances between the analog-to-digital conversion unit 4 and the ground wiring 10 and between the digital circuit unit 5 and the ground wiring 10 can be reduced, which allows for avoiding affection from an analog-to-digital conversion operation on another column.

Sixth Embodiment

Figure 10:
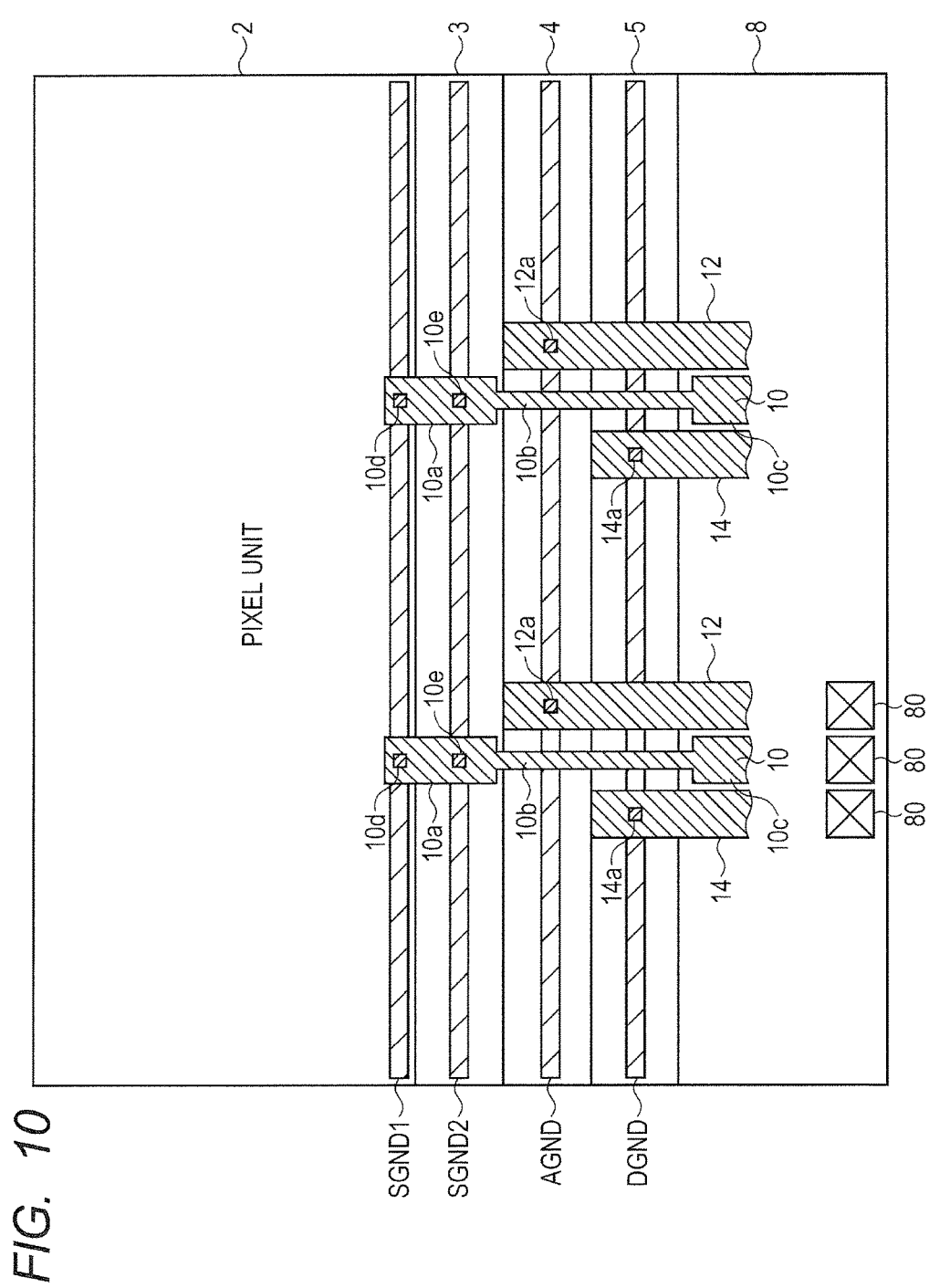
FIG. 10 is a schematic view of a solid state image device of a sixth embodiment.

FIG. 10 is a schematic view of a solid state image device according to the sixth embodiment. The solid state image device according to the present embodiment includes a plurality of groups of the ground wirings 10, 12, and 14. Although respective parts of the ground wiring 10 are formed in a similar manner to the ground wring 10 of the first embodiment, the ground wiring 10 of the second to fifth embodiments may be used. The plurality of the ground wirings 10 may be electrically connected to respective separate electrode pads 80 or may be electrically connected to a common electrode pad 80. When separate electrode pads are provided, the plurality of electrode pads 80 may be electrically connected to each other outside the solid state image device. The ground wirings 12 and 14 are connected to respective separate electrode pads 80 or the common electrode pad 80 in a similar manner. Each electrode pad 80 is electrically connected to an external terminal of a chip by wire bonding.

In the present embodiment, the wiring resistance can be reduced by providing a plurality of groups of the ground wirings 10, 12, and 14. The number of groups of the ground wirings 10, 12, and 14 can be properly changed in accordance with the chip size or the like.

Seventh Embodiment

Figure 11:
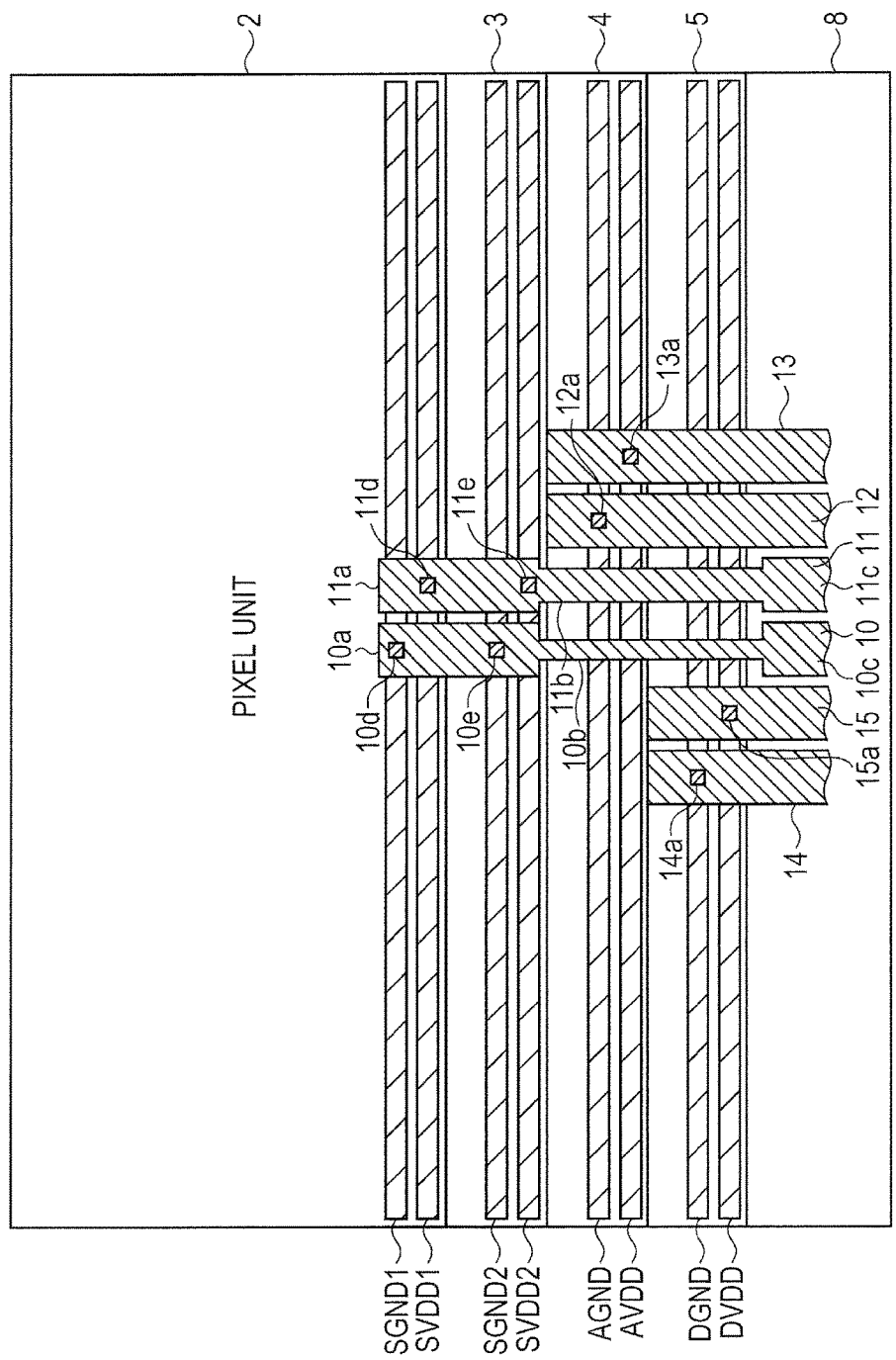
FIG. 11 is a schematic view of a solid state image device of a seventh embodiment.

FIG. 11 is a schematic view of a solid state image device according to the seventh embodiment. The solid state image device according to the present embodiment further includes power source wirings 11, 13, and 15 arranged in the column direction in addition to the ground wirings 10, 12, and 14. The power source wiring 11 is paired with the ground wiring 10 and supplies a power source voltage to the power source wiring SVDD1 of the pixel unit 2 and the power source wiring SVDD2 of the column amplifier circuit unit 3. The power source wiring 11 is arranged adjacent to the ground wiring 10 and includes wiring sections 11*a*, 11*b*, and 11*c*. The wiring section 11*a* is located over the pixel unit 2 and the column amplifier circuit unit 3 and faces the pixel unit 2 and the column amplifier circuit unit 3. The wiring section 11*b* is located over the analog-to-digital conversion unit 4 and the digital circuit unit 5 and faces the analog-to-digital conversion unit 4 and the digital circuit unit 5. The wiring section 11*c* is located over the region 8. The power source wiring 11 has recess portions formed in the wiring section 11*b*, and the width of the wiring section 11*b* is narrower than each width of the different wiring sections 11*a* and 11*c*. This can reduce affection of coupling that would otherwise be caused by the parasitic capacitances between the analog-to-digital conversion unit 4 and the power source wiring 11 and between the digital circuit unit 5 and the power source wiring 11.

Although the width of the wiring section 11*b* of the power source wiring 11 is wider than the width of the wiring section 10*b* of the ground wiring 10 in FIG. 11, the relationship between the widths of the wiring sections 10*b* and 11*b* that form the recess portions is not limited to the illustrated example. For a wiring which is likely to be much affected by coupling with the analog-to-digital conversion unit 4 and the digital circuit unit 5, it is desirable to reduce the width of a wiring section of the recess portion. On the other hand, for a wiring which is less likely to be affected by coupling, the width of a wiring section of the recess portion can be formed wider to reduce the wiring resistance. In such a way, it is possible to optimize a design by properly determining the width of the wiring section of the recess portion in accordance with the degree of affection of coupling. Further, the length of the wiring section of the recess portion may be properly changed in accordance with the degree of affection of coupling.

Eighth Embodiment

Figure 12:
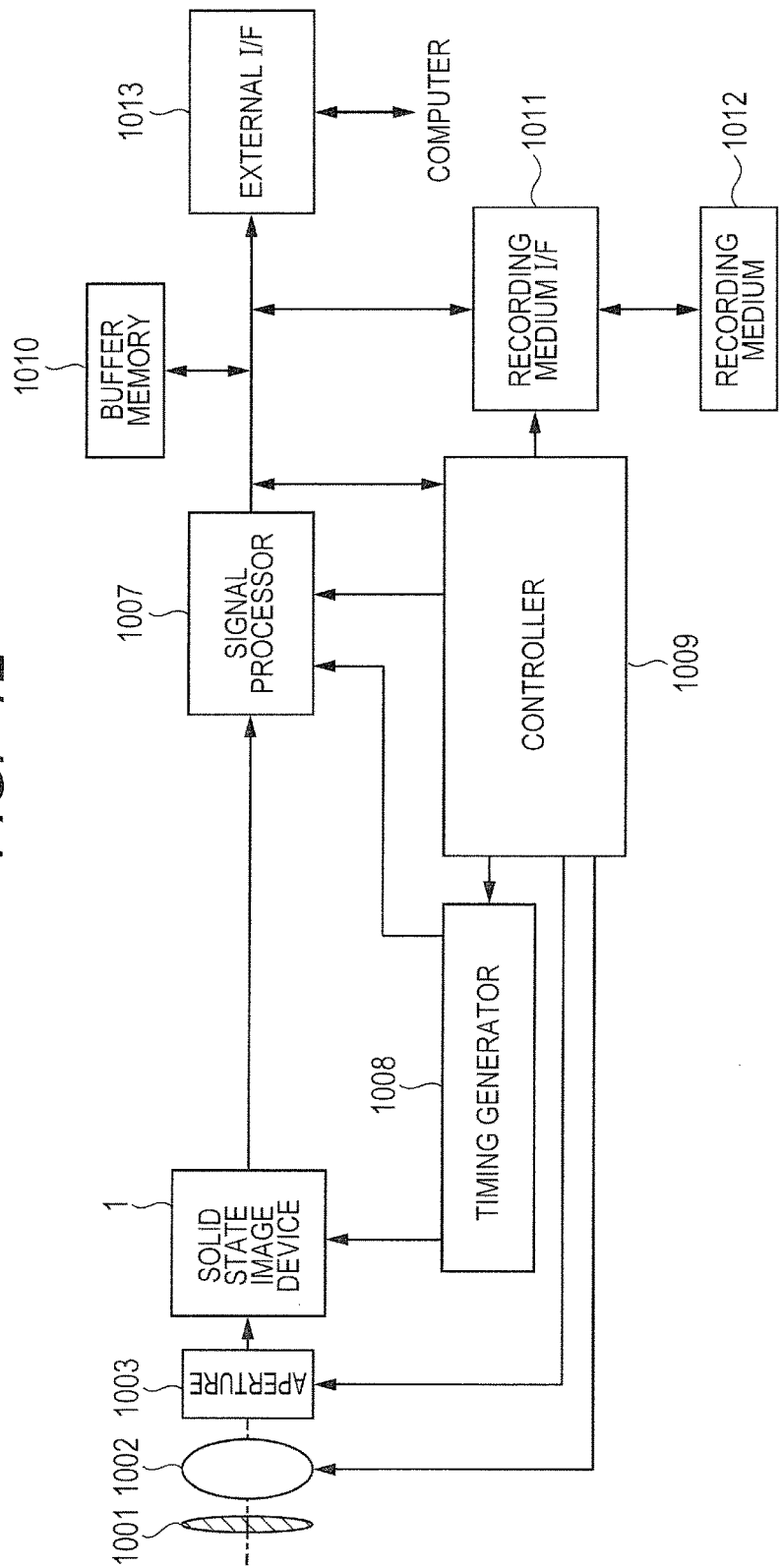
FIG. 12 is a block diagram of an image system of an eighth embodiment.

The solid state image device described in each embodiment above is applicable to various image systems. An example of image systems may be a digital still camera, a digital camcoder, a surveillance camera, or the like. FIG. 12 illustrates a diagram of an image system in which the image device of any of the embodiments described above is applied to a digital still camera as an example of the image system.

The image system exemplified in FIG. 12 has a solid state image device 1, a barrier 1001 for protection of a lens 1002, the lens 1002 for capturing an optical image of a subject on the solid state image device 1, and an aperture 1003 for changing the amount of a light passing through the lens 1002. The lens 1002 and the aperture 1003 form an optics that collects a light into the solid state image device 1. The solid state image device 1 is the solid state image device of any of the embodiments described above. Further, the image system has a signal processor 1007 that processes output signals output from the solid state image device 1. The signal processor 1007 generates an image based on signals output by the solid state image device 1. Specifically, the signal processor 1007 performs various correction and compression as necessity and outputs image data. Further, the signal processor 1007 uses signals output by the solid state image device 1 to perform focus detection.

The image system further has a buffer memory 1010 for temporarily storing image data and an external interface (an external I/F) 1013 for communicating with an external computer or the like. Furthermore, the image system has a recording medium 1012 such as a semiconductor memory for performing recording or readout of captured data and a recording medium interface (a recording medium I/F) 1011 for performing recording or readout to the recording medium 1012. Note that the recording medium 1012 may be incorporated in the image system or may be removable.

Furthermore, the image system has a controller 1009 that controls various operations and the entire digital still camera, and a timing generator 1008 that outputs various timing signals to the solid state image device 1 and the signal processor 1007. In this example, timing signals or the like may be input from the external, and the image system may have at least the solid state image device 1 and the signal processor 1007 that processes output signals output from the solid state image device 1. As described above, the image system of the present embodiment can apply the solid state image device 1 thereto and perform a capturing operation.

Other Embodiments

Any of the embodiments described above is to merely illustrate an embodied example in implementing the present invention, and the technical scope of the present invention should not be construed in a limiting sense by these examples. That is, the present invention can be implemented in various forms without departing from the technical concept thereof or the primary features thereof. For example, the present invention is not limited to the application to a ground wiring or a power source wiring and is applicable to wirings for supplying a predetermined voltage such as a bias voltage, a reference voltage, or the like. Further, when the length of the wiring section 10*a* is sufficiently short, the width Wa of the wiring section 10*a* may be formed to be the same as the width Wb of the wiring section 10*b*. Furthermore, the solid state image device is not limited to the CMOS image sensor and may be a CCD image sensor.

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-233016, filed Nov. 30, 2015, which is hereby incorporated by reference herein in its entirety.

What is claimed is:

1. A solid state image device comprising:
   a pixel unit including a plurality of pixels arranged in a matrix;
   an analog-to-digital conversion unit that converts a signal from the pixel unit into a digital signal;
   a digital circuit unit that processes the digital signal from the analog-to-digital conversion unit; and
   a wiring that supplies a voltage to the pixel unit,
   wherein the wiring includes a first wiring section facing the pixel unit, a second wiring section facing at least one of the analog-to-digital conversion unit and the digital circuit unit, and a third wiring section connected to an electrode pad and between the second wiring section and the electrode pad, and
   wherein a width of the second wiring section is smaller than respective widths of the first wiring section and the third wiring section.

2. The solid state image device according to claim 1, wherein the width of the first wiring section is larger than the width of the third wiring section.

3. The solid state image device according to claim 1 further comprising other wirings that supply voltages to the analog-to-digital conversion unit and the digital circuit unit, respectively, wherein the other wirings do not face the pixel unit.

4. The solid state image device according to claim 3, wherein the width of the first wring section is equal to a distance from one end to the other end of the third wiring section and the other wirings, the distance being in a direction perpendicular to a direction in which the wiring extends from the third wiring section to the first wiring section.

5. The solid state image device according to claim 1, wherein the second wiring section has a recess portion in only one side of the wiring in a planer view with respect to a plane including the matrix.

6. The solid state image device according to claim 1, wherein the first wiring section faces a part of the analog-to-digital conversion unit.

7. The solid state image device according to claim 1, wherein the wiring is connected to an external terminal via the electrode pad, and
   wherein the solid state image device comprises a plurality of the wirings.

8. The solid state image device according to claim 1 further comprising a plurality of the wirings, wherein the plurality of the wirings are electrically connected to each other.

9. The solid state image device according to claim 1, wherein the wiring is a ground wiring that supplies a ground potential.

10. The solid state image device according to claim 1, wherein the wiring is a power source wiring that supplies a power source voltage.

11. The solid state image device according to claim 7, wherein the plurality of the wirings include: a ground wiring that supplies a ground potential; and a power source wiring that supplies a power source voltage.

12. The solid state image device according to claim 11, wherein the width or a length of the second wiring section in the ground wiring is different from the width or a length of the second wiring section in the power source wiring.

13. The solid state image device according to claim 11, wherein the width of the second wiring section of the power source wiring is larger than the width of the second wiring section of the ground wiring.

14. An image system comprising:
   a solid state image device; and
   a signal processing device that processes a signal from the solid state image device,
   wherein the solid state image device includes
   a pixel unit including a plurality of pixels arranged in a matrix;
   an analog-to-digital conversion unit that converts a signal from the pixel unit into a digital signal;
   a digital circuit unit that processes the digital signal from the analog-to-digital conversion unit; and
   a wiring that supplies a voltage to the pixel unit,
   wherein the wiring includes a first wiring section facing the pixel unit, a second wiring section facing at least one of the analog-to-digital conversion unit and the digital circuit unit, and a third wiring section connected to an electrode pad and between the second wiring section and the electrode pad, and
   wherein a width of the second wiring section is smaller than respective widths of the first wiring section and the third wiring section.

* * * * *